(12) United States Patent
Langhammer

(10) Patent No.: US 10,127,013 B1
(45) Date of Patent: Nov. 13, 2018

(54) SPECIALIZED PROCESSING BLOCKS WITH FIXED-POINT AND FLOATING-POINT STRUCTURES

(71) Applicant: Intel Corporation, Santa Clara, CA (US)

(72) Inventor: Martin Langhammer, Alderbury (GB)

(73) Assignee: Altera Corporation, San Jose, CA (US)

( * ) Notice: Subject to any disclaimer, the term of this patent is extended or adjusted under 35 U.S.C. 154(b) by 35 days.

(21) Appl. No.: 15/390,358

(22) Filed: Dec. 23, 2016

(51) Int. Cl.
*G06F 7/487* (2006.01)
*H03M 7/30* (2006.01)
*G06F 7/485* (2006.01)

(52) U.S. Cl.
CPC ............ *G06F 7/4876* (2013.01); *G06F 7/485* (2013.01); *H03M 7/30* (2013.01)

(58) Field of Classification Search
None
See application file for complete search history.

(56) References Cited

U.S. PATENT DOCUMENTS

| | | | |
|---|---|---|---|
| 4,893,268 A | 1/1990 | Denman | |
| 5,751,619 A * | 5/1998 | Agarwal | G06F 7/5312 708/523 |
| 6,085,213 A * | 7/2000 | Oberman | G06F 7/53 708/603 |
| 6,397,240 B1 * | 5/2002 | Fernando | G06F 7/523 708/603 |
| 8,751,551 B2 | 6/2014 | Streicher | |
| 9,098,332 B1 * | 8/2015 | Langhammer | G06F 7/49947 |
| 2003/0158879 A1 * | 8/2003 | Kwon | G06F 7/5443 708/603 |
| 2009/0300323 A1 | 12/2009 | Hessel | |
| 2013/0138711 A1 | 5/2013 | Sugisawa | |

OTHER PUBLICATIONS

Langhammer, U.S. Appl. No. 15/242,923, filed Aug. 22, 2016.

* cited by examiner

*Primary Examiner* — David H Malzahn
(74) *Attorney, Agent, or Firm* — Treyz Law Group, P.C.; Tianyi He

(57) ABSTRACT

Integrated circuits with specialized processing blocks that can support both fixed-point and floating-point operations are provided. A specialized processing block of this type may include partial product generators, compression circuits, and a main adder. The main adder may include a high adder, a middle adder, a low adder, floating-point rounding circuitry, and associated selection circuitry. The middle adder may include prefix networks for outputting generate and propagate vectors, and redundant LSB processing logic for outputting LSB generate and propagate bits. The middle adder may include additional logic circuitry for generating a sum output, a sum-plus-1 output, and a sum-plus-2 output. The specialized processing block may further include accumulation circuitry for support multiply-accumulation functions for any suitable number of channels.

20 Claims, 10 Drawing Sheets

SPECIALIZED PROCESSING BLOCKS WITH FIXED-POINT AND FLOATING-POINT STRUCTURES

BACKGROUND

This relates to a programmable integrated circuit device and particularly to a specialized processing block in a programmable integrated circuit device.

Considering a programmable logic device (PLD) as one example of an integrated circuit device, as applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process audio signals as an example. Such blocks are frequently also referred to as multiply-accumulate ("MAC") blocks, because they include structures to perform multiplication operations, and sums and/or accumulations of multiplication operations.

Typically, the arithmetic operators (adders and multipliers) in such specialized processing blocks are fixed-point operators. If floating-point operators were needed, the user would construct them outside the specialized processing block using general-purpose programmable logic of the device, or using a combination of the fixed-point operators inside the specialized processing block with additional logic in the general-purpose programmable logic.

One impediment to incorporating floating-point operators directly into specialized processing blocks is the need for large addition operations as part of many floating-point operations. For example, floating-point multiplication may require two carry-propagate adders. The carry-propagate adder used in a multiplication operation is the most expensive component of the multiplier in terms of both area and latency.

It is within this context that the embodiments described herein arise.

SUMMARY

Specialized processing blocks such as the DSP blocks described above may be enhanced by including floating-point addition among the functions available in the DSP block, without increasing the number of carry-propagate adders. This is accomplished, in part, by simultaneously computing a sum, as well as that sum plus 1 (in its least significant bit) and that sum plus 2 (in its least significant bits), and then selecting the appropriate result based on the result of another part of the operation. The same structures, and, in particular, at least the sum and sum-plus-1 computations, may be used for both fixed-point operations and floating-point operations.

In accordance with an embodiment, a DSP block may include a multiplier pipeline network that generates redundant form output vectors, a compressor that receives the redundant form output vectors and that also receives additional vectors. The DSP block may be operable in a fixed-point mode and a floating-point mode. During the fixed-point mode, the compressor selectively adds in the additional vectors. During the floating-point mode, a lower portion (e.g., the 23 LSBs) of the redundant form output vectors bypasses the compressor while a higher portion of the redundant form output vectors is routed through the compressor to obtain a floating-point output.

The DSP block may also include a carry propagate adder (CPA) that receives the bypassed lower portion of the redundant form output vectors and the floating-point output from the compressor during the floating-point mode. In particular, the compressor may be configured to insert a '0' at a rounding position of the floating-point output (e.g., at the 24th bit position). The CPA may include at least a first adder (e.g., a lower adder for adding the lower 23 bits) and a second adder (e.g., a middle adder for adding the higher 31 bits). The second adder may include parallel prefix networks for outputting sum outputs, sum-plus-1 outputs, and sum-plus-2 outputs.

In accordance with another embodiment, the digital signal processor may also include multi-channel accumulation circuitry that is interposed in a feedback path coupling the CPA back to an input of the compressor circuits (e.g., a 4:1 compressor circuit). The multi-channel accumulation circuitry may include at least two accumulation registers, at least four accumulation registers, or any suitable number of accumulation registers. The multi-channel accumulation circuitry may further include one or more multiplexers for selectively bypassing any portion of the accumulation registers. In one suitable configuration, the multi-channel accumulation circuitry is implemented as a first-in first-out (FIFO) circuit.

Further features of the invention, its nature and various advantages will be more apparent from the accompanying drawings and following detailed description.

DETAILED DESCRIPTION

In a specialized processing block—particularly a digital signal processing ("DSP") block—the adder is decomposed into a prefix structure aligned with both fixed-point and floating-point modes. In conventional floating-point structures, a carry-propagate adder is used, followed by normalization and then by rounding, which involves a second carry-propagate adder. But according to the present embodiments, three floating-point steps can be combined into single level of carry-propagate adder by calculating different subsets of the carry propagate adder inputs as sum, sum-plus-1, and sum-plus-2. Other subsets of the larger carry-propagate adder are also calculated at the same time. The different subset results can be combined in multiple ways to implement either a floating-point multiplier or multiple different types of fixed-point adder or multiplier combinations. The different subset results can be assembled into the required floating-point or fixed-point values by concatenation, thereby avoiding the need to propagate additional carry values over the subset results to obtain the correct output values.

Figure 1A:
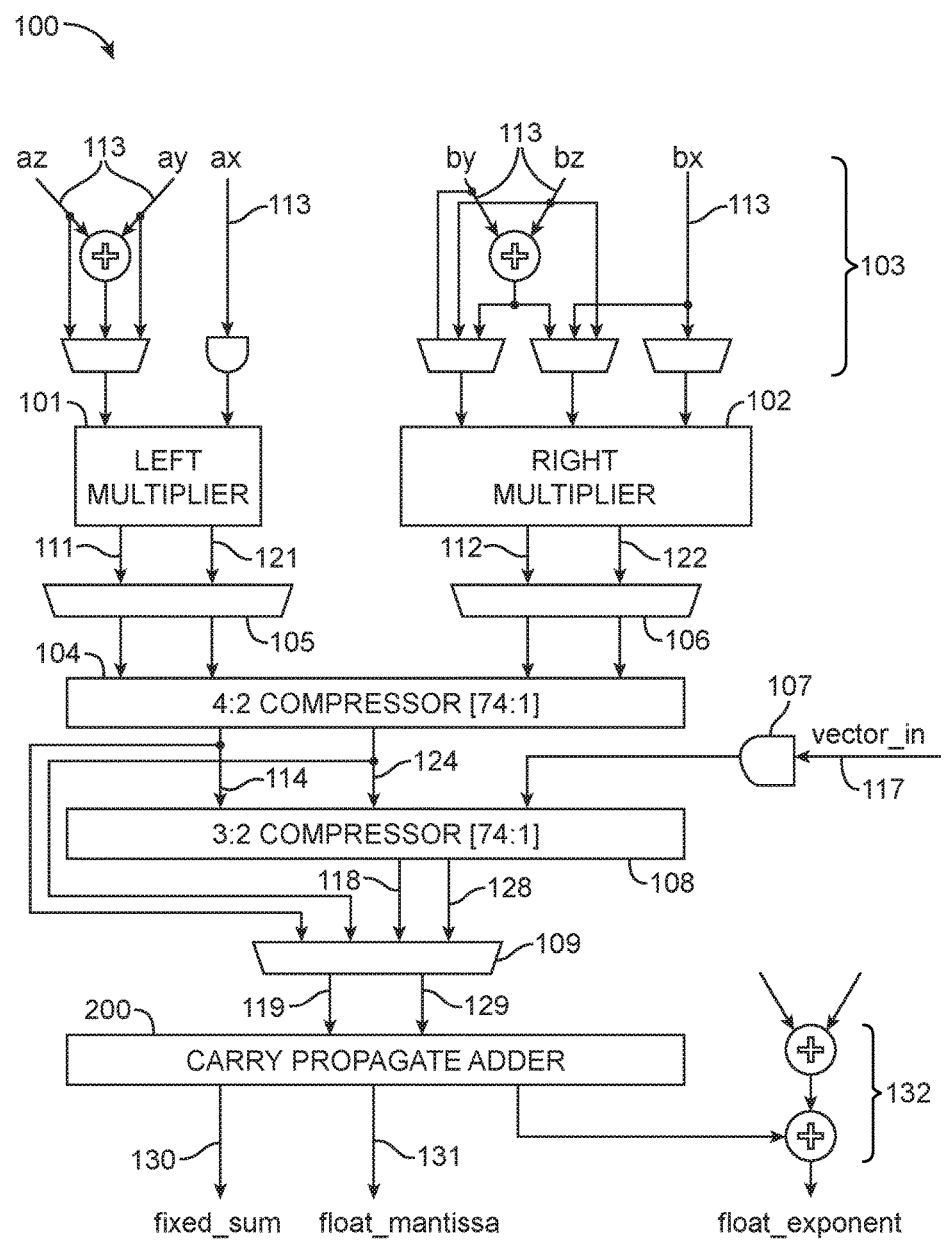
FIG. 1A is a diagram of a multiplier structure of a DSP block with a 3:2 compressor in accordance with an embodiment.

FIG. 1A shows a logical diagram of a specialized processing block such as DSP block 100 that can be configured to perform either fixed-point or floating-point operations. In this logical representation, implementational details, such as registers and some programmable routing features—such as multiplexers that may allow the output of a particular structure to be routed around certain components or directly out of a DSP block (when implemented in a DSP block)—are omitted to simplify discussion.

In the logical representation of FIG. 1A, the "left multiplier" 101 is a partial product generator and compressor structure such as an 18×18 partial product generator and following compressor structure (which may be used, e.g., as two 9×18 partial product generators and compressors), which produce two dimensionless output vectors 111, 121. For example, output vectors 111 and 112 may be sum and carry vectors. Similarly, the "right multiplier" 102 is a partial product generator and compressor structure such as a 27×18 partial product generator and compressor circuit (which may be used, e.g., as an 18×9 partial product generator and compressor circuit and a 27×9 partial product generator and compressor circuit), which produce two dimensionless output vectors 112, 122. Together, partial product generators and compressors 101, 102 can be used as a 27×27 partial product generator and compressor circuit, to support single-precision floating-point multiplication, which under the IEEE754-1985 standard has a mantissa size of 23 (exclusive of an implied leading '1'). Input multiplexer stage 103 combines and aligns between four and six inputs 113 according to the needs of a particular user logic design.

The four dimensionless output vectors 111, 112, 121, 122 are combined by 4:2 compressor 104 into two dimensionless output vectors 114, 124. These dimensionless vectors 114, 124 are sometimes referred to as "redundant form" output vectors. Multiplexers 105, 106 can be used to align vectors 111, 121 and 112, 122, respectively, according to the type of operation being performed, as determined by the user logic design. Specifically, the vectors can be totally offset from one another (e.g., to perform two separate smaller multiplications, such as two 9×9 or 18×18 multiplications), totally aligned with one another (e.g., to perform one the sum of two or more multiplications, such as the sum of two 18×18 multiplications), or partially aligned with one another (e.g., to perform a "rectangular" multiplication, such as a 9×18 multiplication, or even a larger multiplication, such as a 27×27). In one implementation, each of the input and output vectors of compressor 104 may be up to 74 bits wide. The components that generate the redundant for output vectors (e.g., circuitry 103, left and right multipliers 101 and 102, multiplexers 105 and 106, and compressor 104) are sometimes referred to collectively as a multiplier network or a multiplier pipeline.

Another vector 117 may be input from another similar DSP block. Vector 117, along with vectors 114, 124 are input to a 3:2 compressor 108 to output vectors 118, 128. A further multiplexer 109 selects between vectors 114, 124 and vectors 118, 128, allowing compressor 108 to be bypassed if cascade input 117 is not used. Logic AND gate 107 allows input 117 to be zeroed when, for example, the structure is being used in an accumulator mode and when the accumulator has to be reset. Output vectors 119, 129, each up to 74 bits wide, are input to adder 200 to provide the resultant product of the multiplication operation, which can be a fixed-point output 130 or a floating-point output 131. In a floating-point case, the exponent may be handled at exponent handling circuitry 132.

When multiplying two floating-point numbers according to the IEEE754-1985 standard, the input multiplicands are normalized numbers between 1.010 and 1.910. Therefore, the resultant product can be between 1.010 and 3.910, and may be subject to normalization and rounding. To accommodate normalization and rounding, it may be necessary to add either zero, 1, or 210 to the least significant bit(s) of the result. Specifically, normalization involves a right-shift of 0 bits or 1 bit (if the result is greater than or equal to 1.0 and less than 2.010, the right-shift is 0 bits; if the result is greater than or equal to 2.010 and less than 4.010 the right-shift is 1 bit). In cases where rounding is not applied, whether the normalization is 0 bits or 1 bit, the sum-plus-zero (i.e., the sum) may be used. In cases where rounding is applied, then if the normalization is 0 bits, the sum-plus-1 may be used, while if the normalization is 1 bit, the sum-plus-2 may be used. Therefore, in accordance with embodiments of the invention, and as described in more detail below, those three quantities (sum, sum-plus-1 and sum-plus-2) are generated simultaneously using different portions of the circuitry, and then selected using a carry signal from another portion of the calculation. This avoids the need to wait for that other portion of the calculation before generating the appropriate result (sum, sum-plus-1, or sum-plus-2).

Figure 1B:
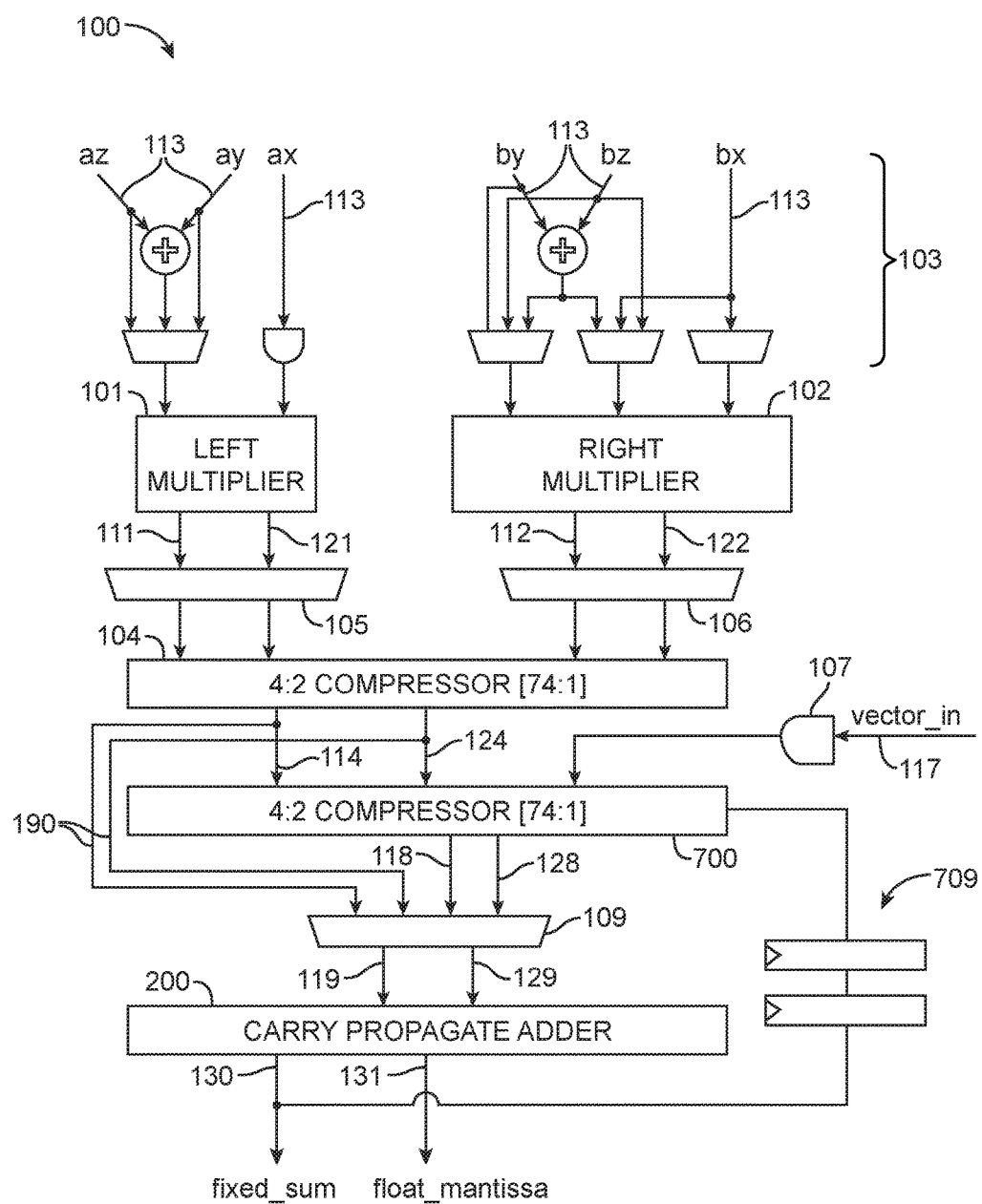
FIG. 1B is a diagram of a multiplier structure of an illustrative DSP block with a 4:2 compressor in accordance with an embodiment.

FIG. 1B shows an improved implementation where 3:2 compressor 108 of FIG. 1A has been replaced by a 4:2 compressor such as compressor 700. Compressor 700 has three inputs 114, 124, and from gate 107, and has an additional input that receives a feedback signal from accumulation circuitry 710. Accumulation circuitry 710 may be used to help implement a multiply-accumulate function. The use of 4:2 compressor 700 allows addition of both the input vector vector_in and the accumulator simultaneously.

While inputs 114, 124 are considered to be redundant form output vectors, inputs from gate 107 and the accumulator circuitry are additional inputs that are "non-redundant." When DSP block 100 is operated in fixed-point mode, compressor 700 may be used to add in vector_in and/or the signal from accumulator 710. When DSP block 100 is operated in floating-point mode, vector_in and the accumulator feedback input are unused while only inputs 114, 124 are used.

In particular, the lower bits (e.g., the lower 23 bits) of the redundant form vectors can be passed directly to CPA 200 via paths 190, bypassing compressor 700, whereas the remaining upper bits of the redundant form vectors are fed through compressor 700 to generate a corresponding sum. Compressor 700 will force a zero in the LSB position of the received vector (e.g., the 24th overall bit position) so that a zero is inserted into the redundant form output vectors at the floating-point rounding position. Configured in this way, the creation of a '0' in one of the redundant form input vectors is not required, as this is handled by compressor 700.

Figure 2:
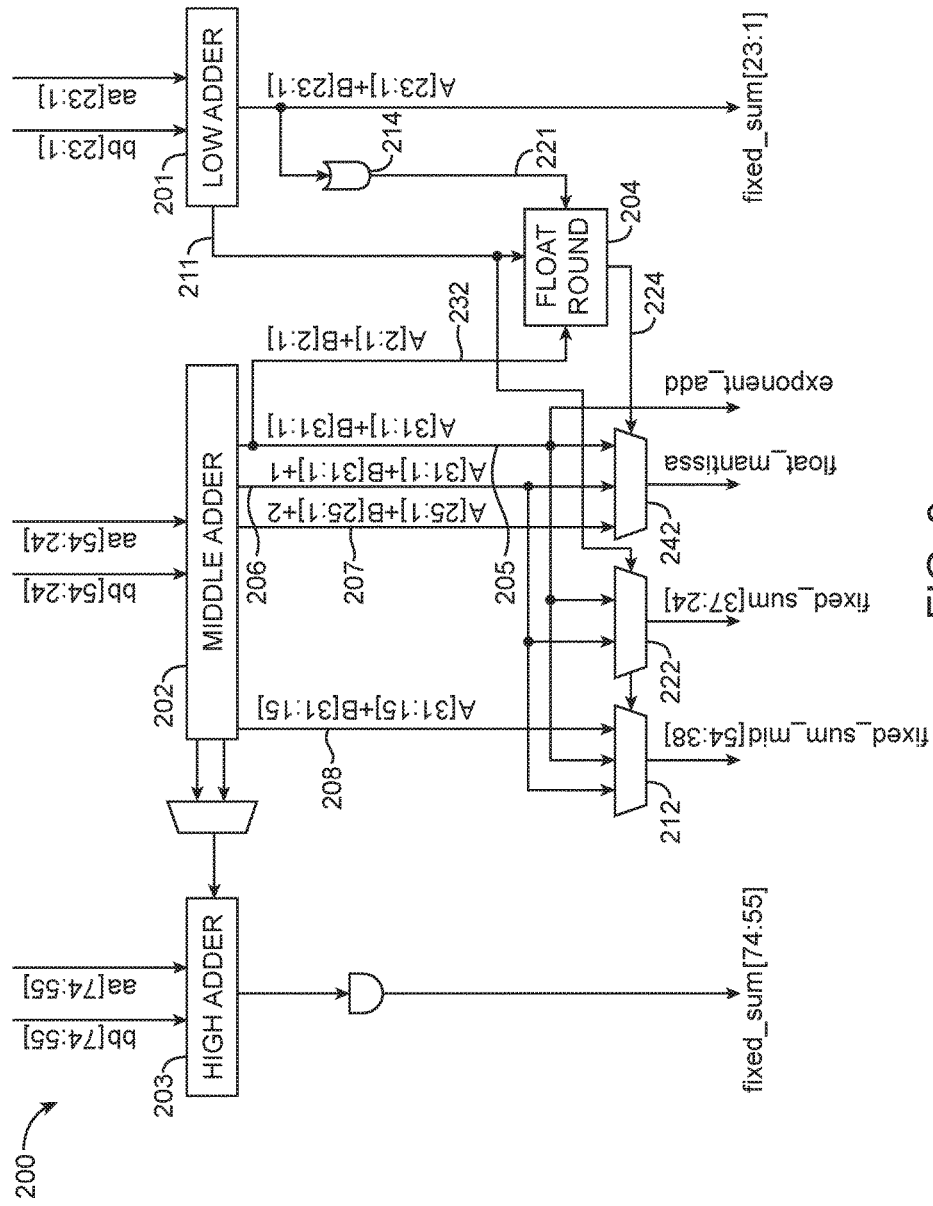
FIG. 2 is a diagram of a deconstructed adder in the structure of FIG. 1 in accordance with an embodiment.

FIG. 2 shows one suitable arrangement in which this is accomplished by decomposing adder 200 (e.g., a carry-propagate adder or "CPA") into three adders—a low adder 201, a middle adder 203, and a high adder 203. Adders 201, 202, 203 can be used together for a single large fixed-point addition (e.g., adding two 74-bit numbers). For other types of additions (which may result from different multiplication operations), adders 201, 202, 203 can be used in different combinations.

In the example of FIG. 2, the inputs of low adder 201 are 23 bits wide, the inputs of adder 202 are 31 bits wide, and the inputs of adder 203 are 20 bits wide. At one extreme, as noted above, adders 201, 202, 203 can be used together to perform a single large fixed-point addition operation (e.g., any addition operation between 55 and 74 bits wide). At the other extreme, adders 201, 202, 203 can be used individually to perform three separate fixed-point addition operations. In between, adders 201, 202, 203 can be used to perform two additions, one or both of which may come from separate multipliers. Thus, one addition operation may be performed in low adder 201 and the lower range of middle adder 202, while a second addition operation may be performed in high adder 203 and the upper range of middle adder 202.

When performing two addition operations as just described, each addition operation could be a fixed-point operation. Alternatively, one or both of the two addition operations could be floating-point operations. In the implementation depicted in FIG. 2, the upper addition operation (i.e., the addition operation performed in high adder 230 and the upper range of middle adder 202) would be a fixed-point operation, while the lower addition operation (i.e., the addition operation performed in low adder 201 and the lower range of middle adder 202) could be either a fixed-point operation or a floating-point operation.

Because an addition operation will be spanning the boundary between low adder 201 and middle adder 202, information must be carried across that boundary. As can be seen in FIG. 2, carry information 211 controls multiplexers 212, 222 which, as described in more detail below, are used for fixed-point operations.

In a floating-point context, the location of the least significant bit of the result could actually straddle the boundary—sometimes falling on one side and sometimes falling on the other—depending on the precision and on the particular input values. Information from low adder 201 is needed, along with other information, to establish the location of the least significant bit. Floating-point rounding logic 204 uses the carry information 211, along with the lower-most bits 232 from adder 202 sticky bit signal 221 (which combines all but the highest bit from adder 201 in OR-gate 214 to determine the presence of a '1' in any bit location, signifying, when the highest bit from adder 201 is a '1', whether the result from adder 201 is exactly 0.510 or greater than 0.510) to generate selection signal 224 to select the correct floating-point output using multiplexer 242.

As discussed briefly above, depending on the particular inputs, the correct output from adder 202 may be either the sum of its inputs (205), the sum of its inputs with 1 added to the least significant bit (206), or the sum of its inputs with 210 added to the least significant bits (207). In one embodiment, the latter possibility is a possibility only in a floating-point addition, while the other two possibilities are possibilities for either fixed-point addition or floating-point addition. Moreover, where the middle adder 202 is being split between two operations, the upper range output 208 of sum 205 may be output separately.

As also discussed in part above, the selection of the appropriate output(s) from adder 202 is made by multiplexers 212, 222, 242. In the floating-point case, as discussed above, one of sum 205, sum-plus-1 206, and sum-plus-2 207 is selected by multiplexer 242 based on selection signal 224 from floating-point rounding logic 204. In a fixed-point case, multiplexers 212, 222 select between the respective ranges of sum 205 and sum-plus-1 206 based on carry signal 211 from low adder 201 (as noted above, sum plus-2 207 is used only in a floating-point case). Only multiplexer 212 may receive the upper range 208 of the sum.

Figure 3:
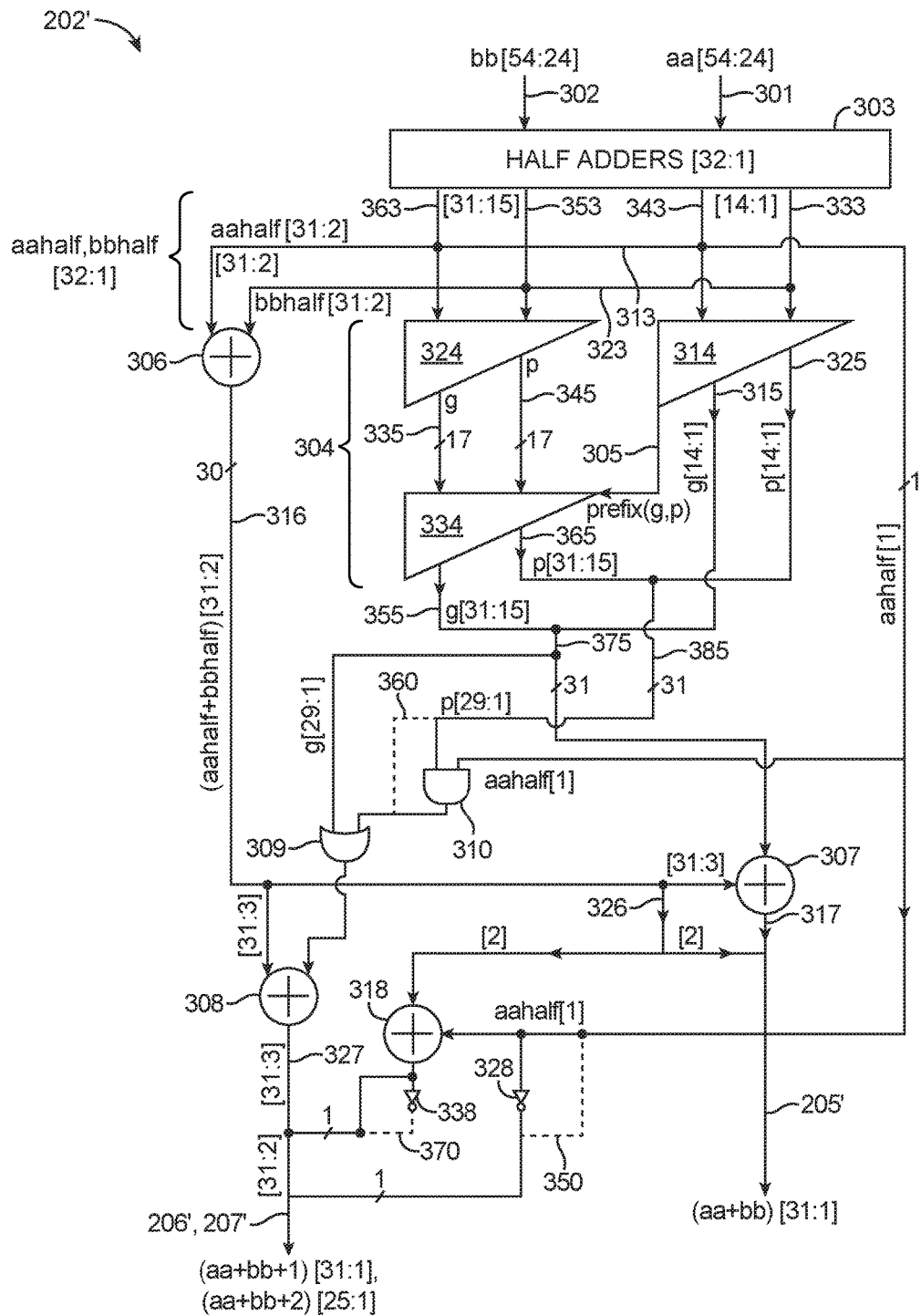
FIG. 3 is a diagram showing one implementation of a portion of a deconstructed adder of the type shown in FIG. 2.

One possible implementation of middle adder 202' is shown in FIG. 3. The 31-bit portions 301, 302 of vectors 119, 129 to be added are input to a half-adder 303, which provides two 32-bit vector outputs, which may be referred to as half-add-sum 313 and half-add-carry 323. Half-add-sum vector 313 is the 31-bit result of the bitwise XOR of vector 301 and vector 302; the 32nd bit is not used. Half-add-carry vector 323 is a 32-bit vector resulting from a 1-bit left-shift of the bitwise AND of vector 301 and vector 302, with a '0' inserted in its least-significant bit position (the most significant bit—i.e., bit 32—of vector 323 is used as carry information from adder 202 to adder 203). The output vectors are divided into lower halves 333, 343 and upper halves 353, 363. These half-adder output vectors are input to a parallel prefix network trees 304, which may include three prefix networks 314, 324, 334. Each prefix network may be, for example, a Kogge-Stone prefix network, which outputs respective generate and propagate vectors.

The lower vectors 333, 343 are input to prefix network 314 to provide generate and propagate vectors 315, 325. The upper vectors 353, 363 are input to prefix network 324 to provide generate and propagate vectors 335, 345. Vectors 335, 345 are input to prefix network 334 along with the prefix(g,p) output 305 of the highest node of network 314. Network 334 outputs generate and propagate vectors 355, 365, which are concatenated with generate and propagate vectors 315, 325 to provide generate and propagate vectors 375, 385.

In order to provide sum output 205', bits 31:2 of half-add vectors 313, 323 are XORed at 306 to provide vector 316, bits 31:3 of which are then XORed at 307 with bits 31:3 of concatenated generate vector 375 to provide vector 317. Vector 317 is then concatenated with the least significant bit 326 of vector 316, and then concatenated with the least significant bit of half-add-sum vector 313 to provide sum 205'.

In order to provide sum-plus-1 output 206' (sometimes referred to as a first incremented sum), bits 31:2 of half-add vectors 313, 323 are XORed at 306 to provide vector 316, bits 31:3 of which are then XORed at 308 with the result of ORing (309) bits 29:1 of concatenated generate vector 375, with the result of ANDing (310) bits 29:1 of concatenated propagate vector 385 and the least significant bit (LSB) of half-add-sum vector 313, to provide vector 327. Vector 327 is then concatenated with the XOR 318 of the least significant bit of half-add-sum vector 313 and the least-significant bit 326 of vector 316, and then concatenated with the inverse 328 of the least significant bit of half-add-sum vector 313 to provide sum-plus-1 206'.

Outputs 205 and 206 can be used for both fixed-point and floating-point calculations and therefore are computed to 31 bits of precision. However, in some embodiments sum-plus-2 output 207 might only be used for floating-point operations. Because the mantissa in IEEE754-1985 floating-point operations is 23 bits wide, in such an embodiment sum-plus-2 output 207 need only be 25 bits wide (although in other embodiments, output 207 might be 31 bits wide like the other sum outputs). In order to provide a 25-bit-wide sum-plus-2 output 207 (sometimes referred to herein as a second incremented sum), bits 25:2 of half-add vectors 313, 323 are XORed at 306 to provide vector 316, bits 25:3 of which are then XORed at 308 with the result of ORing (309) bits 23:1 of concatenated generate vector 375 with bits 23:1 of concatenated propagate vector 385 to provide vector 327. Vector 327 is then concatenated with inverse 338 (see dotted path 370) of the XOR 318 of the least significant bit of half-add-sum vector 313 and the least-significant bit 326 of vector 316, and then concatenated with the least significant bit of half-add-sum vector 313 (see dotted path 350) to provide sum-plus-2 207'. Note that paths 370 and 350 may be switched out of use when computing the sum-plus-1 output and vice versa when computing the sum-plus-2 output. Alternately, the values sum-plus-1 and sum-plus-2 can be calculated in parallel, and then selected by a multiplexer.

As discussed above, the upper range output 208 of middle adder 202 could be provided separately (e.g., for combining with the output of high adder 203). The details on how the upper range output 208 can be generated is not necessary for understanding the present embodiments and are therefore omitted from this disclosure. The detailed implementation for generating output 208 can be found in commonly-assigned U.S. Pat. No. 9,098,332.

Figure 4:
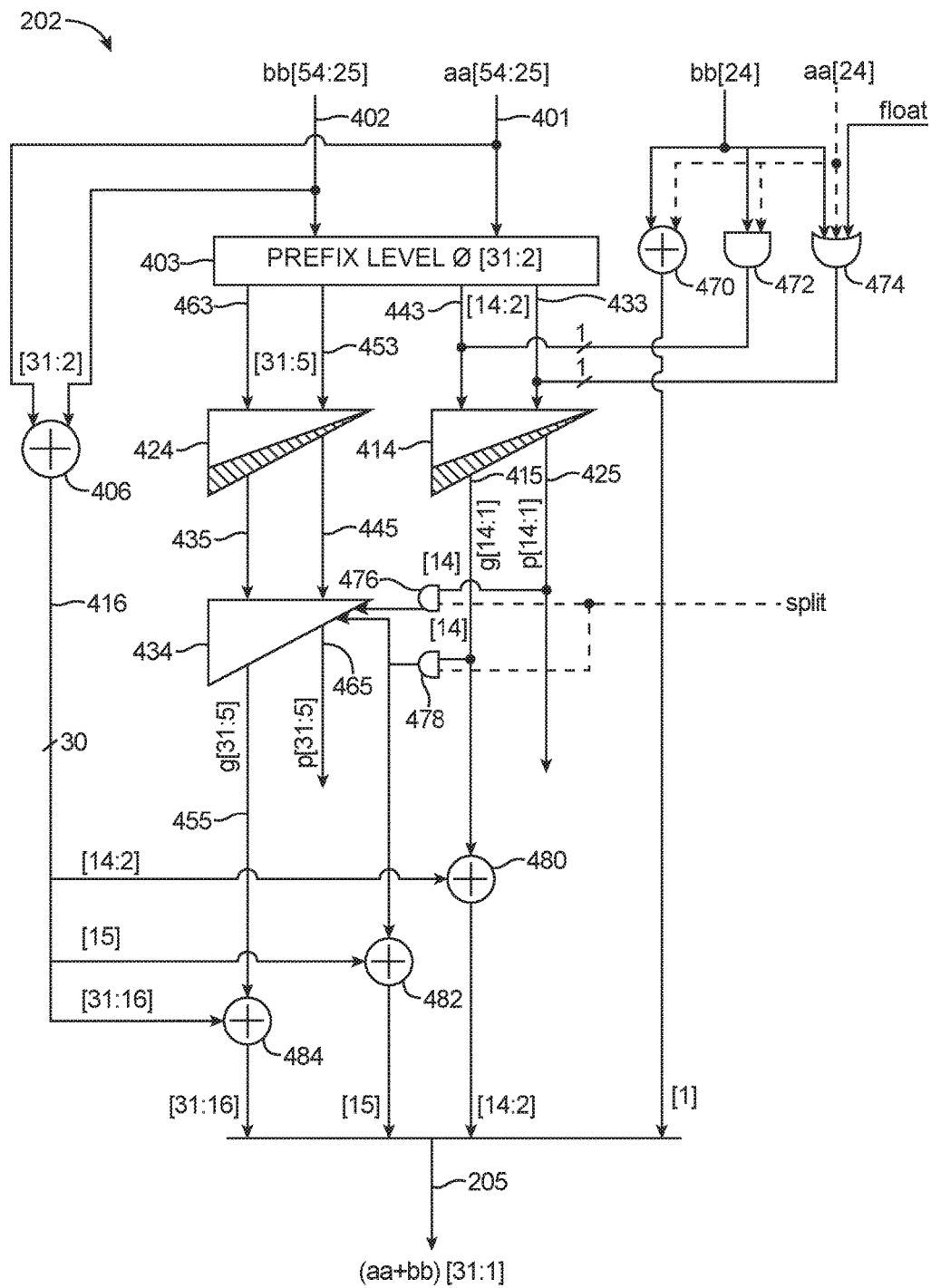
FIG. 4 is a diagram showing another suitable implementation of a portion of a deconstructed adder of the type shown in FIG. 2 configured to output a sum in accordance with an embodiment.

FIG. 4 shows another suitable implementation of middle adder 202 in accordance with an embodiment. As shown in FIG. 4, the new architecture does not include the half-adder level (i.e., half adders 303 from FIG. 3 can be omitted). The prefix level 0 structure 403 of FIG. 4 also exists in FIG. 4, but is separated from the rest of the prefix networks to help illustrate the changes to the redundant LSB processing. Since level zero has been removed from each of prefix networks 414 and 424, prefix networks 414,424 are shaded to show that they are smaller than the original structures.

The 30-bit portions 401, 402 of vectors 119, 129 to be added are input directly to parallel prefix level 0 structure 403, which provides two corresponding vector outputs, which is divided into upper halves 453, 463 and into lower halves 433, 443. The remaining LSB portion of vectors 119, 129 may be handled using redundant LSB processing circuitry (e.g., logic XOR gate 470, AND gate 472, and OR gate 474). Upper vectors 453, 463 may be input directly to parallel prefix network 424. The lower vectors 433, 443 may be concatenated with bits generated using the redundant LSB processing circuitry.

For example, lower vector 433 may be concatenated with the result of ORing (474) the LSB of vector 401, the LSB of vector 402, and a floating-point mode signal (float) and then fed as an input to prefix network 414 to provide generate and propagate vectors 435, 445. The floating-point mode signal may be asserted (e.g., driven high to a logic '1') during floating-point arithmetic operations and may otherwise be deasserted (e.g., driven low to a logic '0'). On the other hand, lower vector 443 may be concatenated with the result of ANDing (472) the LSB of vector 401 and the LSB of vector 402 and then fed as an input to prefix network 443 to provide generate and propagate vectors 415, 425. The XOR result 470 of the LSB of vector 401 and the LSB of vector 402 may directly serve as the LSB of the final sum output 205.

For floating point, the propagation generation starts at the LSB, and will be equal to the sum bit as the carry bit is always zeroed (sum and carry vectors are another way of describing the two redundant form vectors). As the propagate LSB is always forced high for the sum-plus-2 output 207, which is only used for floating-point operations, floating point needs to turn off the propagation contribution of the LSB. The real propagation generation for sum-plus-2 output 207 starts at the second LSB, so the LSB position needs to be forced high so that the propagation signal is not zeroed if both LSBS of vectors 401 and 402 are '0'.

Vectors 435, 445 are input to prefix network 434 along with gated versions of the highest node of network 414. For example, the most significant bit (MSB) of propagate vector 425 may be gated using AND gate 476 based on the polarity of a split control signal. When supporting fixed point operations, the split control signal may be driven high (to signal no splitting) when middle adder 202 is used to support a single operation or may be driven low (to signal an actual split) when middle adder 202 is intended to be split between two operations. The MSB of generate vector 415 may also be gated using AND gate 478 based on the polarity of the split control signal. These two gated signals serve as the prefix(g,p) of the highest node of network 414.

Network 434 outputs generate and propagate vectors 455, 465. Prefix tree structures 403, 414, 424, and 434 may be, for example, a Kogge-Stone prefix network, which outputs respective generate and propagate vectors.

In order to provide sum output 205, bits 31:2 of input vectors 401, 402 are XORed at 406 to provide vector 416, bits 31:16 of which are then XORed at gate 484 with the corresponding bits of generate vector 455, bit 15 of which is then XORed at gate 482 with the output of gate 478, and bits 14:2 of which are then XORed at gate 480 with the corresponding bits of generate vector 415. The LSB output from gate 470 may then be concatenated with the outputs of gates 480, 482, and 484 to provide sum 205. As described above in connection with FIG. 1B, during floating-point mode, the input to the lower 23-bit adder 201 may be taken directly from the last compressor 104 of the multiplier network pipeline, rather than the compressor 700 immediately preceding the adder. As described above, the LSB of sum 205 is now the XOR of the LSB redundant inputs. In the fixed-point mode, the result will be the actual XOR of the two LSBs. In the floating-point mode, one of the inputs will always be '0', so the result will be the other bit.

Figure 5:
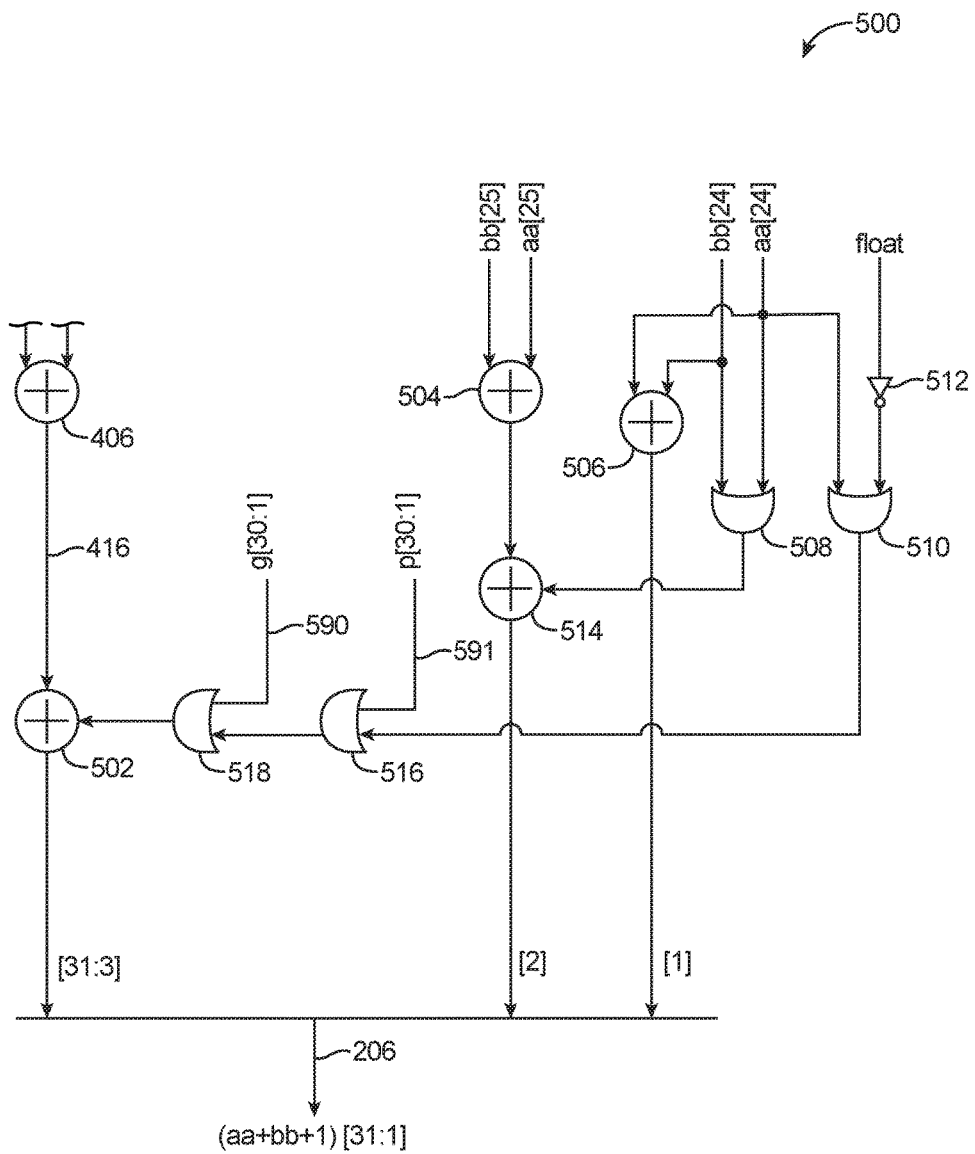
FIG. 5 is a diagram showing additional circuitry that can be included in the portion of FIG. 4 and that is configured to output a first incremented sum in accordance with an embodiment.

FIG. 5 shows additional circuitry 500 that can be coupled to the circuitry of FIG. 4 to provide sum-plus-1 output 206 (sometimes referred to as a first incremented sum). As shown in FIG. 5, circuitry 500 may include gate 506 for XORing the LSB of vector 401 (i.e., aa[24]) with the LSB of vector 402 (i.e., bb[24]), gate 508 for ORing the LSB, gate 510 for ORing the LSB of vector 401 with an inverted version of the floating-point mode control signal (e.g., a float-point mode signal fed through inverter 512), and gate 504 for XORing the second LSB of vector 401 (i.e., aa[25]) and the second LSB of vector 402 (i.e., bb[25]). The output of XOR gate 506 may serve as the LSB of sum-plus-1 output 206. The output of XOR gate 504 may be XORed (514) with the output of gate 508 to generate the second LSB of sum-plus-1 output 206.

Generate vectors 455 and 415 from FIG. 4 may be concatenated to form generate vector 590 in FIG. 5. Similarly, propagate vectors 465 and 425 from FIG. 4 may be concatenated to form propagate vector 591 in FIG. 5. Propagate vector 591 may be ANDed (516) with the output of gate 510. Generate vector 590 may be ORed (518) with the output of gate 516. Gate 502 may be used to XOR vector 416 with the output of gate 518 to generate the remaining MSB bits of sum-plus-1 output 206.

Outputs 205 and 206 can be used for both fixed-point and floating-point calculations and therefore are computed to 31 bits of precision. However, in some embodiments sum-plus-2 output 207 might only be used for floating-point operations. Because the mantissa in IEEE754-1985 floating-point operations is 23 bits wide, in such an embodiment sum-plus-2 output 207 need only be 25 bits wide (although in other embodiments, output 207 might be 31 bits wide like the other sum outputs). In order to provide a 25-bit-wide sum-plus-2 output 207 (sometimes referred to herein as a second incremented sum), additional circuitry 600 may be coupled to the circuitry of FIG. 4. Note that circuit 406 in FIGS. 4-6 is the same circuit (e.g., the sum, sum-plus-1, and sum-plus-2 generation can all share the same circuit 406).

Figure 6:
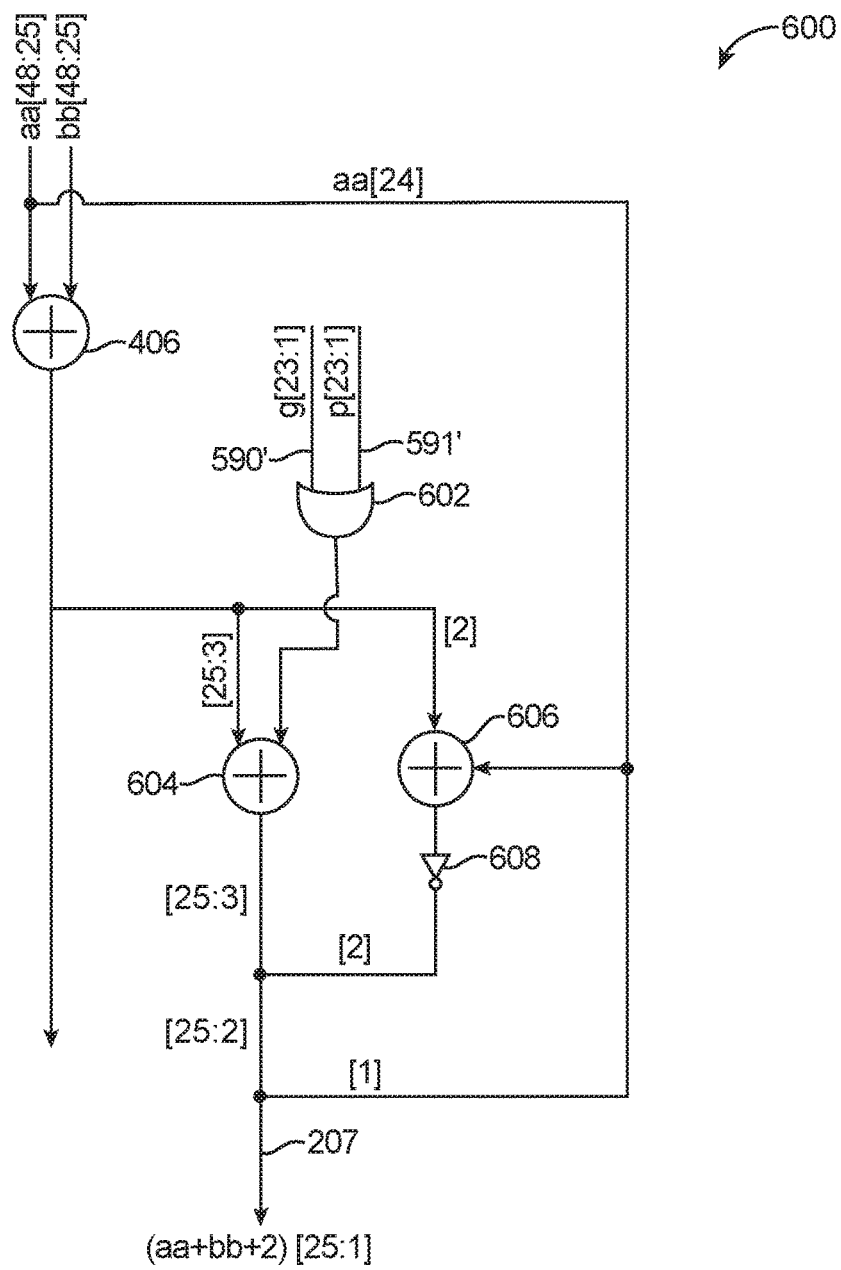
FIG. 6 is a diagram showing additional circuitry that can also be included in the portion of FIG. 4 and that is configured to output a second incremented sum in accordance with an embodiment.

As shown in FIG. 6, circuitry 600 may include gate 602 for ORing the lower 23 bits of generate vector 590' and the lower 23 bits of propagate vector 591', gate 604 for XORing bits [25:3] at the output of gate 403 with the output of gate 602, gate 606 for XORing bit [2] at the output of gate 403 with the LSB of vector 401 (i.e., aa[24]), and inverter 608 for inverting the output of gate 606. The 23 output bits of gates 604, the output bit of gate 608, and the LSB bit of vector 401 may be concatenated in that order to provide sum-plus-2 output 207.

Figure 7:
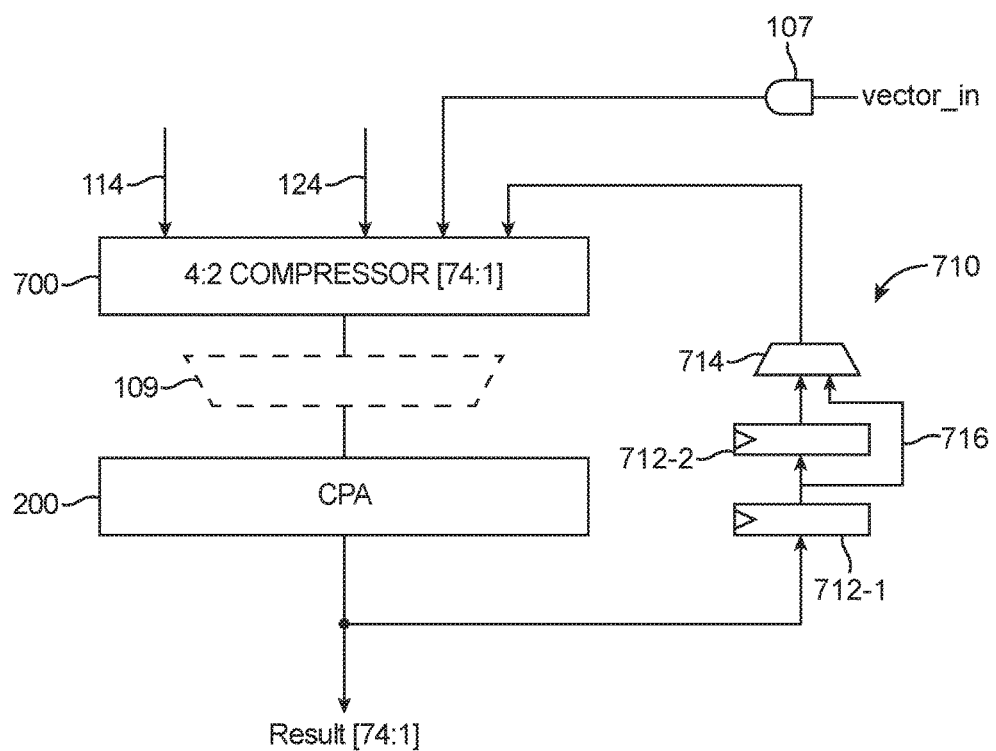
FIG. 7 is a diagram showing how a multiplier structure of the type described in connection with the embodiments of FIGS. 1-6 can be configured as a two-channel accumulator in accordance with an embodiment.

In accordance with another suitable embodiment that is not mutually exclusive with the embodiments shown in FIGS. 2-6, the DSP block of FIG. 1 can be further modified to serve as a dual channel accumulator (see, e.g., FIG. 7). In the example of FIG. 7, 4:2 compressor 700 is used instead of 3:2 compressor 108. Compressor 700 has three inputs 114, 124, and from gate 107, and has an additional input that receives a feedback signal from accumulation circuitry 710. Moreover, multiplexer 109 for bypassing compressor 700 may be optionally omitted. The use of 4:2 compressor 700 allows addition of both the input vector vector_in and the accumulator simultaneously. The 4:2 compressor can also handle the functions of the half adders 303.

As shown in FIG. 7, accumulation circuitry 710 may include two accumulation registers 712-1 and 712-2 interposed in the feedback path between the output of CPA 200 and the fourth input of compressor 700. Circuitry 710 may also include multiplexer 714 that is interposed in the feedback path to selectively switch second register 712-2 in and out of use. Enabling second register 712-2 will introduce an extra clock cycle delay in the feedback path of the accumulator. Configured in this way, the modified DSP block may produce outputs that alternative between a first channel and a second channel (e.g., the even clock cycles serve the first channel, whereas the odd cock cycles serve the second channel).

Figure 8:
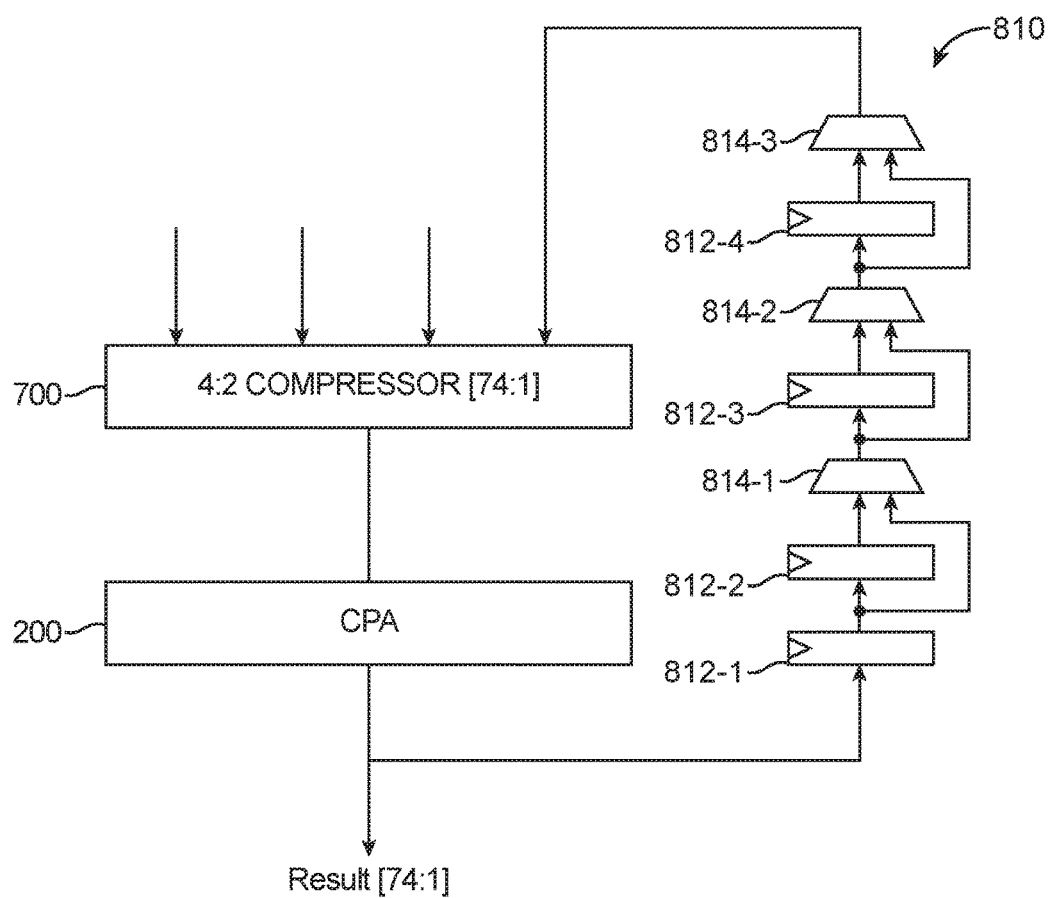
FIG. 8 is a diagram showing how a multiplier structure of the type described in connection with the embodiments of FIGS. 1-6 can be configured as a quad-channel accumulator in accordance with an embodiment.

This concept can be further extended to accumulators with more than two channels. FIG. 8 shows an arrangement that supports accumulation in four separate channels. As shown in FIG. 8, accumulation circuitry 810 may include accumulation registers 812-1, 812-2, 812-3, and 812-4 coupled together with configurable bypass multiplexers 814-1, 814-2, and 814-3. Multiplexer 814-1 may be configured to selectively bypass register 812-2. Multiplexer 814-2 may be configured to selectively bypass register 812-3. Multiplexer 814-3 may be configured to selectively bypass register 812-4. The bypass multiplexers may be dynamically or statically configured to support accumulation for up to four channels in this particular example. In general, the accumulation circuitry in the feedback path can include any suitable number of accumulation registers and configurable bypass multiplexers to support accumulation for any suitable number of channels.

Figure 9:
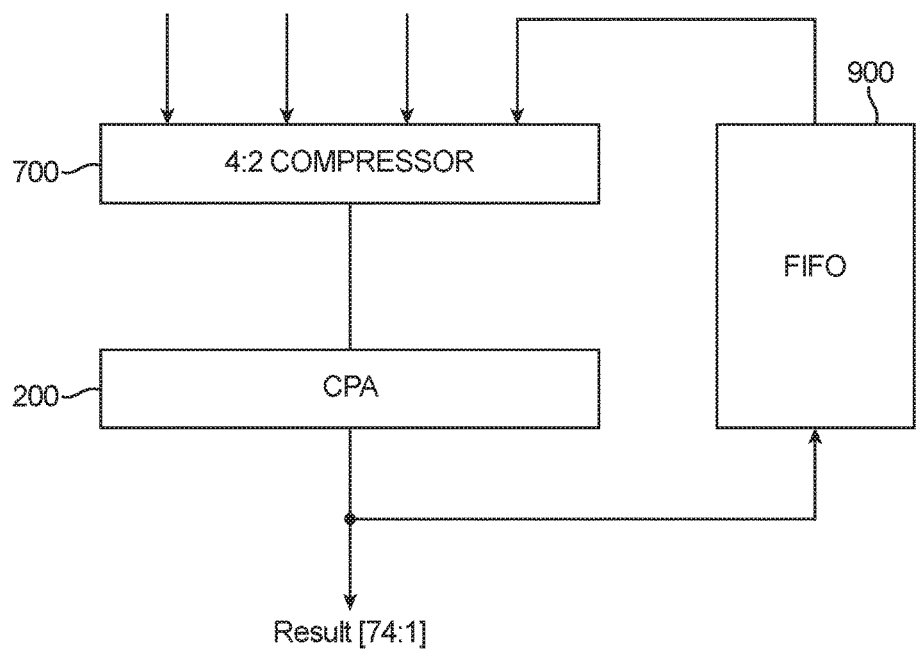
FIG. 9 is a diagram showing how a multiplier structure of the type described in connection with the embodiments of FIGS. 1-6 can be configured as a FIFO-based accumulator in accordance with an embodiment.

FIG. 9 shows yet another suitable arrangement in which the accumulation circuitry may be implemented using a memory-based scheme such as using a first-in first-out (FIFO) circuit. As shown in FIG. 9, a FIFO circuit 900 may be interposed in the feedback path between the output of CPA 200 and the fourth input of compressor 700. To support three channel accumulation, a write pointer may keep track where every group of three outputs are stored in FIFO 900. At the same time, the read pointer may follow the write pointer to read out each group of three outputs in the order in which they have been loaded into FIFO circuit 900.

The arrangements of FIGS. 7-9 in which the DSP block of FIG. 1 can be further occupied to serve as a multiply-accumulation blocks for support any number of channels using any suitable storage scheme is merely illustrative. If desired, other types of memory such as dual-port random-access memory, shift register, or register file may be used to help implement the dynamic accumulation function.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The foregoing is merely illustrative of the principles of this invention and various modifications can be made by those skilled in the art. The foregoing embodiments may be implemented individually or in any combination.

What is claimed is:
1. An integrated circuit, comprising:
a specialized processing block that comprises:
a multiplier network that generates redundant form output vectors;
a compressor that receives the redundant form output vectors from the multiplier network and that also receives additional vectors, wherein:

during a fixed-point mode, the compressor selectively uses the additional vectors to generate an output of the compressor; and during a floating-point mode, a first portion of the redundant form output vectors bypasses the compressor while a second portion of the redundant form output vectors is routed through the compressor to obtain a floating-point output, and the compressor provides a value of zero at a rounding position of the floating-point output; and a carry propagate adder that receives the first bypassed portion of the redundant form output vectors and the floating-point output from the compressor during the floating-point mode.

2. The integrated circuit of claim 1, wherein the compressor provides the value of zero at a least significant bit position of the second portion of the redundant form output vectors.

3. The integrated circuit of claim 1, wherein the compressor comprises a 3:2 compressor circuit.

4. The integrated circuit of claim 1, wherein the compressor comprises a 4:2 compressor circuit.

5. The integrated circuit of claim 1, wherein the carry propagate adder comprises:
a first adder that receives the first portion of the redundant form output vectors; and
a second adder that receives the floating-point output from the compressor.

6. The integrated circuit of claim 5, wherein the second adder contains prefix networks.

7. The integrated circuit of claim 6, wherein the prefix networks in the second adder includes a level-zero prefix network that receives only a subset of the floating-point output.

8. The integrated circuit of claim 7, wherein the second adder further includes:
redundant least significant bit (LSB) processing logic circuits that only receive another subset of the floating-point output.

9. The integrated circuit of claim 8, wherein the redundant LSB processing logic circuits comprises:
an AND gate for outputting a generate LSB; and
an OR gate for outputting a propagate LSB, wherein the OR gate receives a floating-point control signal.

10. The integrated circuit of claim 8, wherein the prefix networks in the second adder further comprises:
a first reduced prefix network that receives signals from the level-zero prefix network;
a second reduced prefix network that receives signals from the level-zero prefix network and the redundant LSB processing logic circuits; and
a third prefix network that receives signals from the first and second reduced prefix networks.

11. The integrated circuit of claim 10, wherein the second adder is configured to output a sum output, a sum-plus-1 output, and a sum-plus-2 output.

12. A method of operating a specialized processing block, comprising:
with a multiplier pipeline in the specialized processing block, generating redundant form outputs;
with a compressor circuit in the specialized processing block, receiving the redundant form outputs and first and second non-redundant form outputs, wherein the compressor circuit receives the first non-redundant form output at a first input terminal of the compressor and the second non-redundant form output at a second input terminal of the compressor that is separate from the first input terminal;
during a fixed-point mode, using the compressor circuit to process the first and second non-redundant form outputs; and
during a floating-point mode, using the compressor circuit to process only the redundant form outputs.

13. The method of claim 12, further comprising:
with a carry propagate adder in the specialized processing block, receiving processed signals from the compressor circuit and the multiplier pipeline; and
routing at least a portion of the redundant form outputs to bypass the compressor circuit during the floating-point mode.

14. The method of claim 13, wherein the carry propagate adder includes a first adder that generates a fixed-point output and a second adder that generates a floating-point output, the method further comprising:
with a level-zero prefix structure in the second adder, receiving a first subset of the redundant form outputs; and
with redundant least significant bit (LSB) processing circuitry in the second adder, receiving a second subset of the redundant form outputs.

15. The method of claim 14, further comprising:
with additional parallel prefix structures in the second adder, receiving signals from the level-zero prefix structure and redundant LSB processing circuitry and outputting a sum output, a sum-plus-1 output, and a sum-plus-2 output.

16. An integrated circuit, comprising:
a digital signal processor that comprises:
partial product generation circuits;
a compressor circuit that receives signals from the partial product generation circuits;
a carry propagate adder circuit that receives signals from the compressor circuit; and
multi-channel accumulation circuitry interposed in a feedback path connecting the carry propagate adder circuit back to an input of the compressor circuit.

17. The integrated circuit of claim 16, wherein the digital signal processor is operable in a fixed-point arithmetic mode of operation and in a floating-point arithmetic mode of operation.

18. The integrated circuit of claim 16, wherein the multi-channel accumulation circuitry includes at least two accumulation registers and a multiplexer for selectively bypassing one of the two accumulation registers.

19. The integrated circuit of claim 16, wherein the multi-channel accumulation circuitry comprises a first-in first-out (FIFO) circuit.

20. The integrated circuit of claim 16, wherein the multi-channel accumulation circuitry comprises data storage circuitry interposed in the feedback path.

* * * * *